US012589445B2

(12) United States Patent
Diepstraten et al.

(10) Patent No.: US 12,589,445 B2
(45) Date of Patent: Mar. 31, 2026

(54) SOLDERING SYSTEM AND METHOD OF USE

(71) Applicant: Illinois Tool Works Inc., Glenview, IL (US)

(72) Inventors: Gerardus Johannes Adrianus Maria Diepstraten, Dongen (NL); Antonie Cornelis Colijn, Nieuwendijk (NL)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/576,890

(22) PCT Filed: Jun. 10, 2022

(86) PCT No.: PCT/US2022/033076
§ 371 (c)(1),
(2) Date: Jan. 5, 2024

(87) PCT Pub. No.: WO2023/283022
PCT Pub. Date: Jan. 12, 2023

(65) Prior Publication Data
US 2025/0128344 A1 Apr. 24, 2025

(30) Foreign Application Priority Data
Jul. 6, 2021 (GB) ..................................... 2109747

(51) Int. Cl.
*B23K 3/00* (2006.01)
*B23K 1/00* (2006.01)
(Continued)

(52) U.S. Cl.
CPC .......... *B23K 3/0653* (2013.01); *B23K 1/0008* (2013.01); *B23K 1/085* (2013.01);
(Continued)

(58) Field of Classification Search
CPC .. B23K 1/085; B23K 1/0016; B23K 2101/42; B23K 3/0607; H05K 3/3468; H05K 3/34; H05K 2203/1509
See application file for complete search history.

(56) References Cited

U.S. PATENT DOCUMENTS

| | | | | |
|---|---|---|---|---|
| 6,039,805 A | * | 3/2000 | Davis ..................... | B23K 3/082 |
| | | | | 118/74 |
| 12,017,341 B2 | * | 6/2024 | Motowaki .............. | B23K 37/00 |

(Continued)

FOREIGN PATENT DOCUMENTS

| | | |
|---|---|---|
| EP | 2928634 B1 | 2/2018 |
| JP | 2013254888 | 12/2013 |

OTHER PUBLICATIONS

Int'l Search Report and Written Opinion Appln No. PCT/US2022/033076 mailed Oct. 31, 2022.

(Continued)

*Primary Examiner* — Erin B Saad
(74) *Attorney, Agent, or Firm* — McAndrews, Held & Malloy, Ltd.

(57) ABSTRACT

A soldering system for processing at least one printed circuit board. The system comprises a first solder pot and a second solder pot, each configured to move within a movement plane. At least one of the first solder pot and the second solder pot is further configured to rotate about a solder pot axis extending transverse to the movement plane. The first solder pot and the second solder pot can be moved relative to the at least one printed circuit board, and at least one of the first solder pot and the second solder pot can be rotated about its solder pot axis relative to the at least one printed circuit board, to simultaneously process the at least one printed circuit board using both solder pots. The soldering system may thus be used to process either a single printed circuit board with both solder pots simultaneously or a pair (Continued)

of printed circuit boards simultaneously with each solder pot processing one of the pair of printed circuit boards. A corresponding soldering method is also disclosed.

16 Claims, 4 Drawing Sheets

(51) Int. Cl.
B23K 1/08          (2006.01)
B23K 3/06          (2006.01)
H05K 3/3468      (2026.01)
B23K 101/42      (2006.01)

(52) U.S. Cl.
CPC ........ H05K 3/3468 (2013.01); B23K 2101/42 (2018.08); H05K 2203/044 (2013.01); H05K 2203/30 (2013.01)

(56)                References Cited

U.S. PATENT DOCUMENTS

| | | | |
|---|---|---|---|
| 2003/0111517 A1* | 6/2003 | Takaguchi | H05K 3/3468 |
| | | | 228/180.1 |
| 2017/0209949 A1* | 7/2017 | Colijn | H05K 13/0061 |
| 2018/0093340 A1* | 4/2018 | Kressmann | B23K 1/203 |
| 2021/0060678 A1* | 3/2021 | Diepstraten | B23K 1/0016 |
| 2022/0009017 A1* | 1/2022 | Colijn | B23K 1/0016 |
| 2022/0016724 A1* | 1/2022 | Colijn | B23K 3/0646 |
| 2024/0359245 A1* | 10/2024 | Colijn | B23K 3/08 |

OTHER PUBLICATIONS

Lensch P et al: "Spezialitaeten Automatisch Loeten", F & M Feinwerktechnik Mikrotechnik Mikroelektronik, Hanser, Munchen, DE, vol. 105, No. 7/08, Jul. 1, 1997 (Jul. 1, 1997), pp. 532-534, XP000732567, ISSN: 1437-9503 p. 533, column 2-column 3 p. 534, column 1.

* cited by examiner

SOLDERING SYSTEM AND METHOD OF USE

RELATED APPLICATIONS

The present application is a national stage application under 35 U.S.C. § 371 of application Serial No. PCT/US2022/033076, filed on Jun. 10, 2022, and entitled "SOLDERING SYSTEM AND METHOD OF USE" and claims the benefit of GB Patent Application No. 2109747.2, filed Jul. 6, 2021 which is incorporated herein by reference.

FIELD OF THE DISCLOSURE

The present disclosure relates to a soldering system and a method of using such a soldering system in a soldering process. In particular, the present disclosure relates to a soldering system including two solder pots that can move and orientate relative to, and simultaneously process, at least one printed circuit board (PCB). For example, the two solder pots can move and orientate relative to, and simultaneously process, a single printed circuit board or a pair of printed circuit boards.

BACKGROUND

Selective soldering can be used in many soldering applications, for example soldering components of a printed circuit board (PCB). A particular form of selective soldering is point-to-point soldering.

In point-to-point soldering processes, typically a small solder pot, or soldering assembly 1 (as shown in FIG. 1), generally containing only one nozzle 2, is used. The solder pot 1 may further comprise a tray or other support structure for the nozzle 2 which is configured to be moveable within a soldering machine. Nozzle 2 comprises a body portion 4 having an inlet at its lower end (not visible in FIG. 1) and an outlet 6 for dispensing liquidus solder 8. Solder 8 overflows from the outlet 6 and the pin is dragged through or dipped into the flowing solder (or conversely the nozzle may be moved relative to the pin). That is, during the soldering operation, the nozzle, the PCB, or both, are movable relative to one another. Nozzle 2 further comprises a side wall portion 10. The junction between the side wall portion 10 and the body portion 4 defines a channel to guide solder dispensed from the outlet 6 back into a supply of liquidus solder (for instance, a reservoir located proximal to the nozzle 2, and within the solder pot 1). In point-to-point soldering processes each solder joint is soldered separately.

Some known point-to-point soldering assemblies include a Solder Drainage Conditioner (SDC) 12, which is arranged downstream of the nozzle and projects a jet or stream of de-bridging fluid towards the nozzle outlet and soldered pins to help prevent bridging of solder between adjacent soldered connections. The de-bridging fluid may comprise a jet of nitrogen heated to a temperature above the liquidus temperature of the solder.

As used herein, when referring to 'solder' in use within a nozzle, it is to be understood that the solder is in a liquid state.

In point-to-point soldering systems, sometimes multiple solder pots are used. The solder pots of the soldering system may be movable together, for instance, through use of a robot, relative to a static PCB or other component to be soldered. Movement of the solder pots may be in two-dimensional space in the plane of a PCB (for instance, in the X-Y plane). Movement may alternatively be in three-dimensional space in the plane of a PCB (for instance, in the X-Y plane) and additionally, towards and away from the PCB (for instance, along the Z axis). In the processing of a PCB board, the solder pots are moved together so that a nozzle of one of the solder pots deposits solder onto a solder pin. Optionally, the solder pots may solder multiple solder pins arranged side by side. The solder pots are then moved to the location of subsequent pins to deposit solder thereon. When multiple solder pins require soldering, the synchronised movement of solder pots is undesirable since the soldering process would be inefficient.

The spacing between solder pins on PCBs continue to become smaller over time in order to integrate them into increasingly compact electronic devices, PCBs having solder pins arranged in various configurations depending on the desired application. For example, solder pins may be arranged at different locations, elevations and orientations. It therefore becomes important to process PCBs in an efficient and versatile way. When a nozzle of a soldering assembly includes a de-bridging gas outlet, this is placed downstream of the nozzle (that is, downstream in the sense of relative movement between the nozzle and the pin to be soldered so that de-bridging occurs subsequent to the deposition of solder). The provision of such a de-bridging gas outlet prevents bridging of solder between adjacent soldered connections. When a de-bridging gas outlet is provided downstream of the nozzle in this way, the nozzle assembly must then approach a solder pin from a side away from such a de-bridging gas outlet, restricting movement. This further decreases the efficiency and processing speed of the soldering system.

It would be advantageous to produce a soldering system that helps overcome the above described problems. Particularly, it would be advantageous to improve the efficiency of processing PCBs. Particularly, it would be advantageous to provide a soldering system with improved versatility and processing speed.

SUMMARY OF THE DISCLOSURE

The present invention is defined by the appended claims.

According to a first aspect of the present disclosure there is provided a soldering system for processing at least one printed circuit board, comprising: a first solder pot and a second solder pot, each configured to move within a movement plane. The movement plane may be defined by orthogonal X and Y axes. At least one of the first solder pot and the second solder pot defines a solder pot axis extending transverse to the movement plane and is further configured to rotate about the solder pot axis. The solder pot axis may be normal to the movement plane, for instance parallel to a Z axis which is orthogonal to the X and Y axes. The first solder pot and the second solder pot can be moved within the movement plane relative to the at least one printed circuit board, and at least one of the first solder pot and the second solder pot can be rotated about its solder pot axis relative to the at least one printed circuit board, to simultaneously process the at least one printed circuit board using both solder pots.

The soldering system may thus be used to process either a single printed circuit board with both solder pots simultaneously or a pair of printed circuit boards simultaneously with each solder pot processing one of the pair of printed circuit boards.

Thus, the first solder pot and the second solder pot are each movable (that is, may be translated) independently of one another within a three-dimensional space, and at least one of the solder pots can be orientated relative to a solder pin. Optionally, both solder pots are moveable and rotatable within a three-dimensional space. This is particularly advantageous since each solder pot can individually and simultaneously process separate portions of at least one PCB, improving the processing speed. In some examples both solder pots can rotate. Moreover, at least one of the solder pots can approach a solder pin from any direction, which makes the soldering assembly versatile. Particularly, each solder pot may include a nozzle which is configured to form an asymmetric solder wave such that different portions of the nozzle circumference may be suitable for soldering different types of components. Accordingly, it is desirable to be able to rotate the solder pot such that the optimum portion of the solder wave is presented to the solder pin as the nozzle is moved relative to the solder pin. Also, when access to a particular solder pin is limited to a specific direction or orientation, at least one of the first and second solder pots can be rotated to gain access to that solder pin. Where access of the solder pot itself to the solder pin is restricted by an obstructing downstream de-bridging gas outlet, the rotation and orientation of at least one solder pot may be in a way that the de-bridging gas outlet is moved away from the solder pins. It should be appreciated that although the present disclosure relates to a soldering system for processing at least one printed circuit board, the soldering system may also be suitable for processing a different component to be soldered. The soldering system may be suitable for processing, using multiple solder pots, a single printed circuit board, a pair of printed circuit boards, or more than two printed circuit boards.

In some examples a displacement member may also be rotatable about one or both of an X axis and a Y axis defining the movement plane, in addition to an axis transverse to the movement plane, for instance parallel to the Z axis, in this way, the orientation of the solder pot may be adjusted to be better positioned to process at least one printed circuit board. More specifically, the orientation of the solder pot may be adjusted to be bettered positioned to deposit solder onto a solder pin.

According to a second aspect of the present disclosure there is provided a method of using a soldering system in a soldering process for processing at least one printed circuit board, comprising the steps of: (a) providing a first solder pot; (b) providing a second solder pot; (c) moving the first solder pot and the second solder pot within a movement plane relative to the at least one printed circuit board; (d) rotating at least one of the first solder pot and the second solder pot about a solder pot axis extending transverse to the movement plane relative to the at least one printed circuit board; and (e) simultaneously processing the at least one printed circuit board using both solder pots.

Thus, the first solder pot and the second solder pot are moved and rotated independently of one another in order to simultaneously process at least one printed circuit board within a three-dimensional space, and at least one of the solder pots can be orientated relative to a solder pin. The processing of the printed circuit board is therefore made more efficient and versatile. In addition, when access to a particular solder pin is limited to a specific direction or orientation, at least one of the first and second solder pots can be rotated to gain access to that solder pin. It should be appreciated that although the present disclosure relates to a soldering system for processing at least one printed circuit board, the soldering system may also be suitable for processing a different component to be soldered. The soldering system may be suitable for simultaneously processing, using multiple solder pots, a single printed circuit board, a pair of printed circuit boards, or more than two printed circuit boards.

For the avoidance of doubt, any of the features described herein apply equally to any aspect of the disclosure.

BRIEF DESCRIPTION OF THE DRAWINGS

Embodiments of the disclosure are further described hereinafter with reference to the accompanying drawings, in which.

In the drawings like reference numerals refer to like parts.

DETAILED DESCRIPTION

In its most general form, a soldering system is disclosed including a first solder pot and a second solder pot where each solder pot is able to move, that is translate within a movement plane and at least one solder pot is able to rotate about a solder pot axis extending transverse to the movement plane. In some examples one or both solder pots are able to translate along their solder pot axes. In the specific examples given below the movement plane is defined by X and Y axis, however the present disclosure is not limited to solder pots moving only parallel to the X and Y axes. Furthermore, in the examples given below the or each solder pot axis is parallel to the Z axis, and thus normal to the movement plane, though again the present disclosure is not limited to this: the solder pot axes may be inclined relative to the movement plane. In the examples below both solder pots are rotatable about respective solder pot axes that need not be parallel to one another, and neither is required to be normal to the movement plane (though one or both may be, that is parallel to the Z axis).

Advantageously, examples of the present disclosure allow the solder pots to move independently of one another to process different portions of at least one PCB, and at least one solder pot to orientate themselves in order to approach solder pins from any direction.

Figure 1:
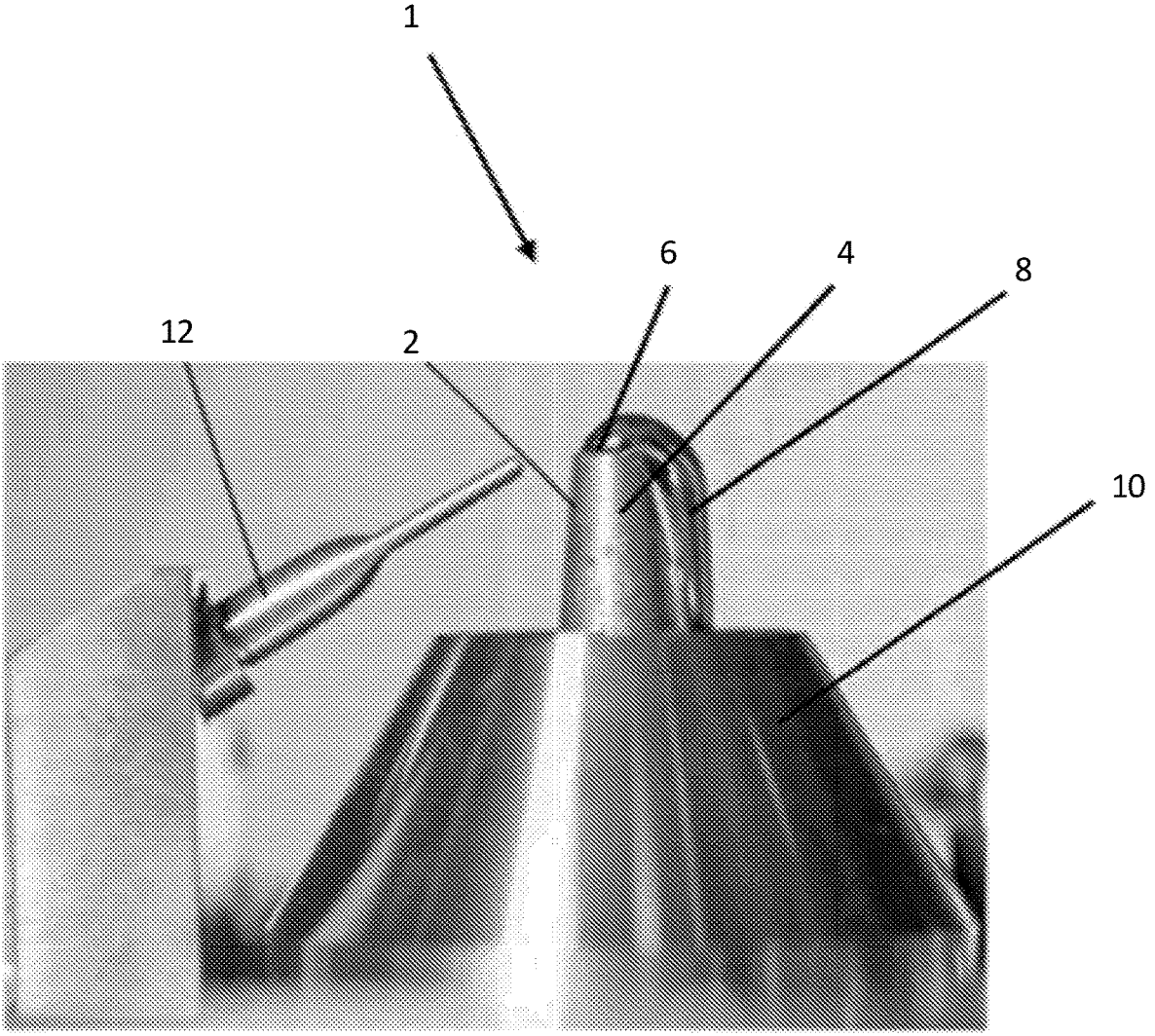
FIG. 1 illustrates a side view of a solder pot for use in point-to-point soldering processes.
Figure 2:
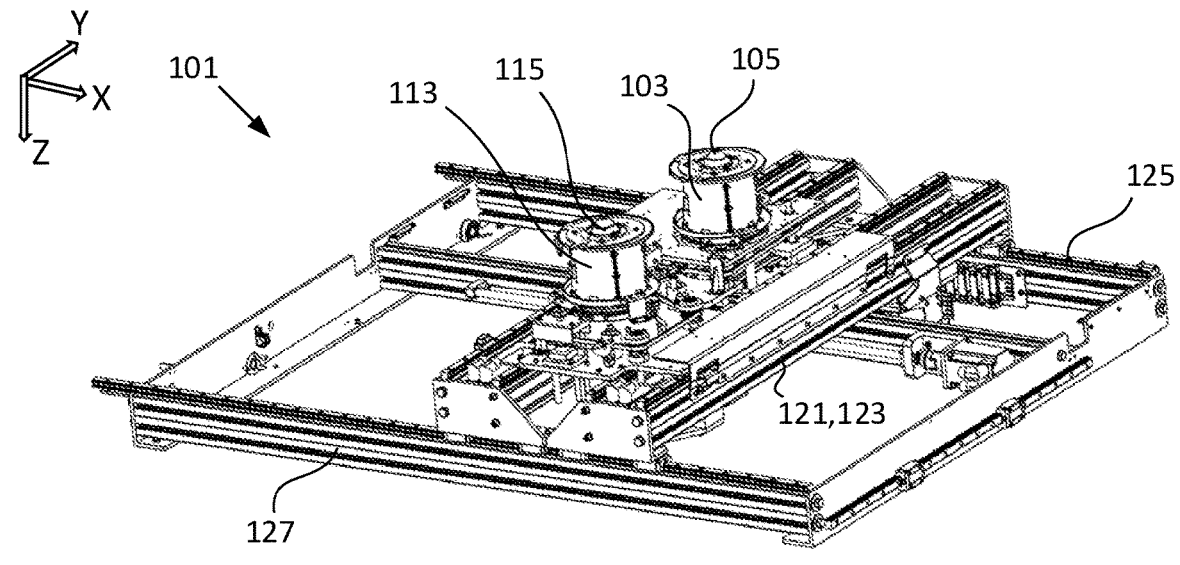
FIG. 2 illustrates a perspective view of a soldering system according to an example of the present disclosure.
Figure 3:
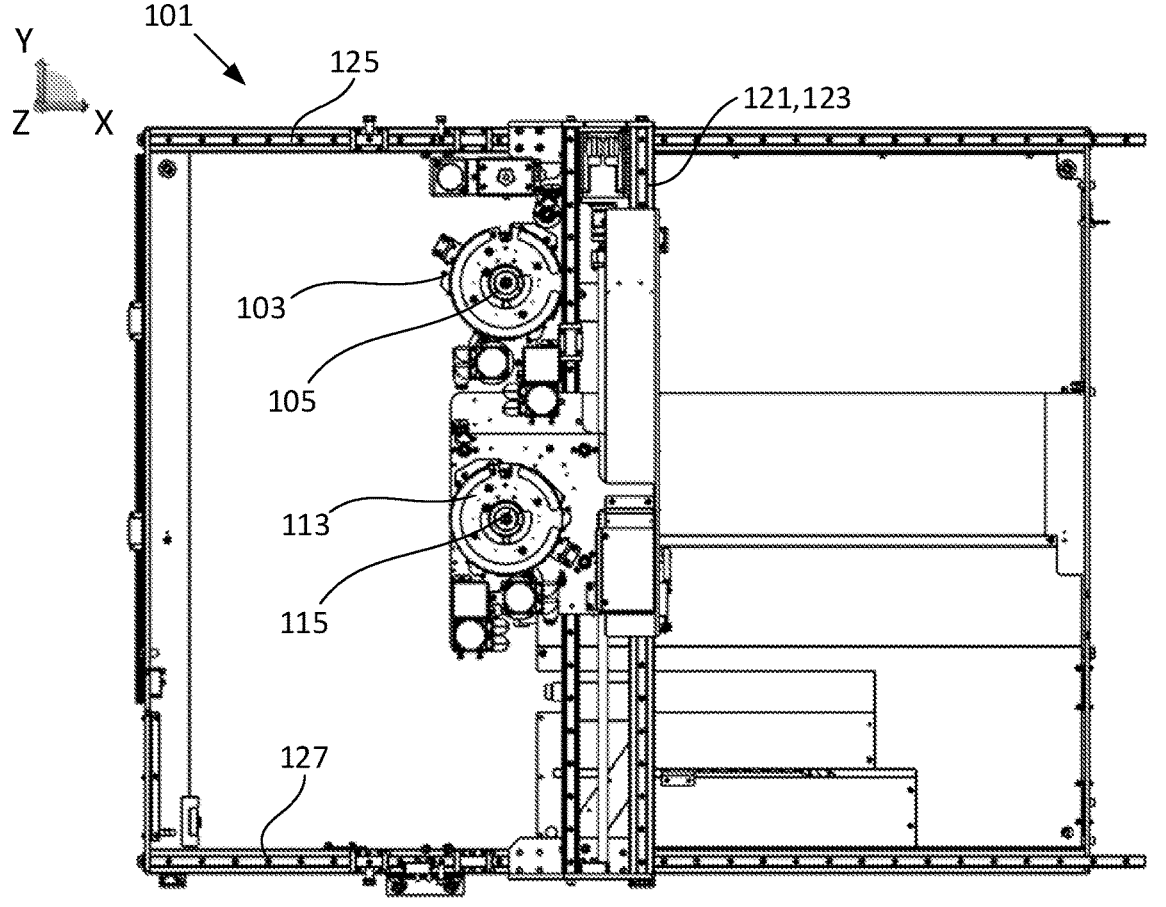
FIG. 3 illustrates a top plan view of a soldering system according to an example of the present disclosure.

Referring now to FIG. 2 and FIG. 3, there is shown a soldering system 101. The soldering system 101 includes a first solder pot 103 and a second solder pot 113 mounted on a robot frame in order to move the solder pots 103,113 parallel to X and Y axes (defining a movement plane), and along solder pot axes parallel to the Z axis.

The X, Y and Z axes are orthogonal to one another. The robot frame includes a first X axis frame member 125 and a second X axis frame member 127 arranged oppositely facing one another and each arranged parallel to the X axis. The robot frame also includes first and second Y axis frame members 121,123, each arranged parallel to the Y axis. The solder pots 103,113 are coupled to the robot frame by being mounted on rails, and are displaceable along the robot in the X and Y direction by use of chain drives (not shown). Other ways of moving the solder pots 103,113 parallel to the X and Y axes are also envisaged as will be evident to the skilled person, such as belts, cables, hydraulics, for example, or other electrical or mechanical actuators. The first solder pot 103 is provided with a nozzle 105. The second solder pot 113 is also provided with a nozzle 115.

Each of the first solder pot 103 and the second solder pot 113 include a jack (not shown) for moving each solder pot 103,113 parallel to the Z axis. Other methods of moving the solder pots 103,113 along the Z axis are also envisaged, such as mounting the solder pots 103,113 onto rails, displaceable in a direction parallel to the Z axis, or using belts, cable, or hydraulics, for example, or other electrical or mechanical actuators. It should be understood that the actuators may include a single actuator along or about each axis for both solder pots 103,113 or may include individual actuators along or about each axis for the first solder pot 103 and the second solder pot 113 separately. The position and orientation of the solder pots 103,113 may be controlled centrally by a controller (not shown).

Each nozzle 105,115 includes an inlet for receiving a supply of solder, and a channel for directing the supplied solder to an outlet to be dispensed. The solder may be supplied to the inlet of each nozzle 105,115 from a solder reservoir. In this example embodiment, the nozzles 105,115 are non-wettable nozzles which, in use, allows solder to flow unidirectionally, for example, to a front side of a nozzle. This means that solder does not overflow and wet the entire nozzle (i.e. the full 360 degrees). In other words, the nozzles 105,115 produce an asymmetric solder wave 107,117 (see FIG. 4, for example). It should also be appreciated that while in this example embodiment, the nozzles 105, 115 are both non-wettable nozzles, the nozzles 105,115 may alternatively be wettable nozzles that provide solder overflowing the entire nozzle (on all sides). To reduce or eliminate bridging between adjacent soldered connections for either a wettable nozzle or a non-wettable nozzle, a de-bridging gas outlet may be provided downstream of the nozzle. Where used, a de-bridging gas outlet is arranged to be on the downstream side of the nozzle: as the nozzle traverses and solders pins, the de-bridging gas outlet directs a de-bridging gas generally towards the soldered pin to reduce bridging.

The system soldering system 101 may be used to solder a printed circuit board (PCB) 50 in a conventional fashion for point-to-point soldering operations.

Figure 4:
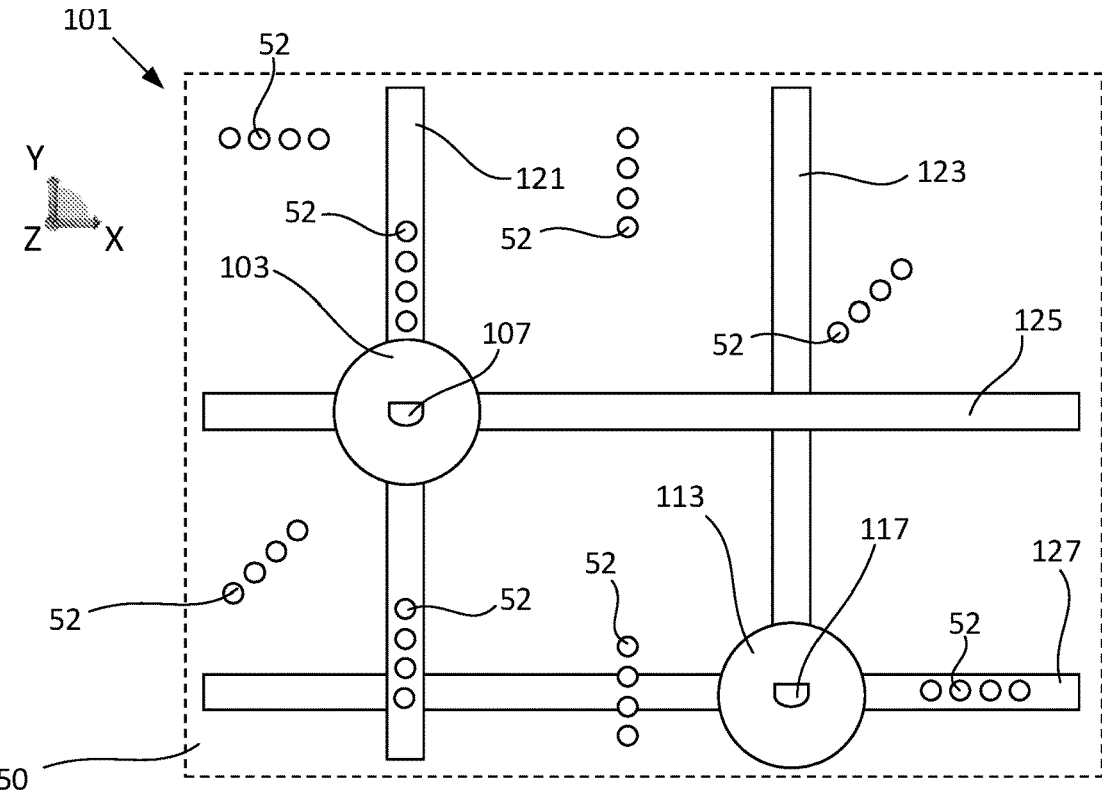
FIG. 4 illustrates a schematic illustration of a soldering system according to an example of the disclosure.

Referring now to a schematic illustration shown in FIG. 4, the first solder pot 103 is coupled to the first X axis frame member 125 and the first Y axis frame member 121. Similarly, the second solder pot 113 is coupled to the second X axis frame member 127 and the second Y axis frame member 123. This allows the solder pots 103,113 to move independently from each other, in the X-Y movement plane parallel to the surface of the PCB 50. The surface of the PCB 50 includes a number of solder pins 52. Some solder pins 52 are arranged in groups parallel to the X axis. Other solder pins 52 are arranged in groups parallel to the Y axis. Other solder pins 52 are arranged off-parallel to the X and Y axes. In some examples pins 52 may be located individually or in any pattern across the underside of the PCB 50. Though not shown, the solder pots 103,113 are movable along the Z axis (for instance, into and out of the page).

During use, the solder wave 107,117 produced by the respective nozzles are orientated in a predetermined direction such that when the solder wave 107,117 contacts a solder pin 52, solder is deposited onto the solder pin 52. Solder pins 52 are typically arranged such a series of pins 52 are aligned and grouped together. In order to solder the group of pins, the solder wave 107,117 of the respective solder pot 103,113 is moved along a predetermined direction to contact a first solder pin 52 in that group of pins 52, and then towards subsequent pins 52 within that group. In order to align the solder wave 107,117 of the respective solder pot 103,113 with the pins, the solder pot 103,113 is rotated about the central axis (the solder pot axis) of the solder pot 103,113. Although in this example embodiment, both solder pots 103,113 are rotated about its solder pot axis, it is envisaged that one of the solder pots 103,113 is rotated about its solder pot axis, while the other solder pot does not rotate about its solder pot axis. For example, the solder pot that is fixed may have a wettable nozzle, while the solder pot that is rotatable may have a non-wettable nozzle. In addition, the solder pot provided with a non-wettable nozzle may be provided with a SDC for finer pitch connections and the ability to de-bridge adjacent soldered connections.

In this particular example, the solder pot axis of the solder pots 103,113 is parallel to the Z axis. In other example embodiments, it is envisaged that the solder pot axis of the solder pots 103,113 may not be parallel to the Z axis. For example, the solder pot axis one or both of the solder pots may be offset relative to the Z axis, for example a 5 degree offset. The orientation of the nozzle (that is, rotation about its solder pot axis) is important, especially when a Solder Drainage Conditioner (SDC) is arranged downstream of the nozzle, since the SDC must be arranged in a specific orientation to de-bridge adjacent soldered connections, for both non-wettable and wettable nozzles.

Figure 5:
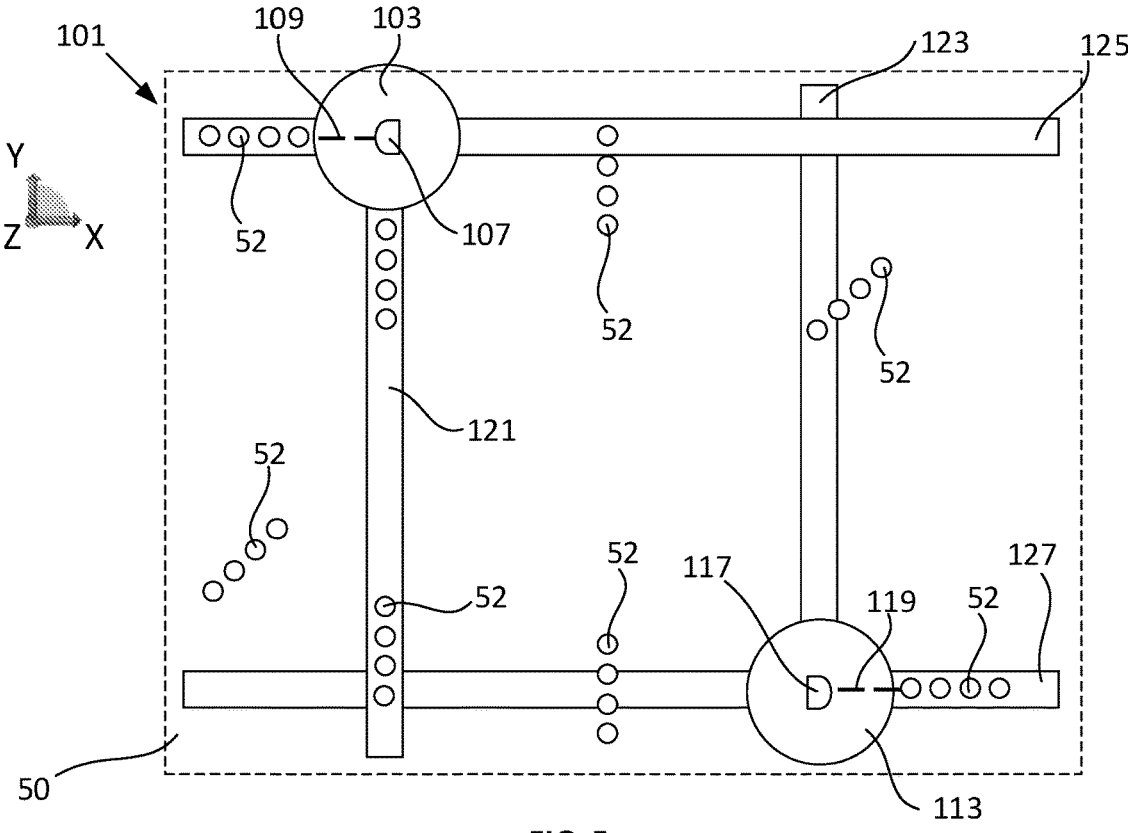
FIGS. 5 and 6 illustrate schematic illustrations of a soldering system according to examples of the disclosure, having first and second solder pots displaced and rotated in various positions and orientations relative to a printed circuit board.

FIG. 5 shows a configuration in which the first solder pot 103 is rotated clockwise about the Z axis by 90 degrees and the second solder pot 113 is rotated anticlockwise about the Z axis by 90 degrees (relative to the orientation of FIG. 4). The solder wave 107 of the first solder pot 103 is orientated towards a direction parallel to the X axis in the "–X" direction to align with and process solder pins 52 which are themselves also positioned parallel to the X axis. The direction of travel of the first solder pot 103 is denoted by numeral 109 in a direction parallel to the X axis. The solder wave 117 of the second solder pot 113 is orientated parallel to the X axis in the "+X" direction to align with and process solder pins 52 which likewise are positioned parallel to the X axis. The direction of travel of the second solder pot 113 is denoted by numeral 119 in a direction parallel to the X axis. The solder pots 103,113 therefore process different parts of the PCB 50 simultaneously. In this example embodiment, the solder pots 103,113 are moved along the Z axis towards the PCB 50 in the "+Z" direction (for instance, into the page) to align with the height of the solder pins 52, and then after soldering the pins 52, the solder pots 103,113 are moved away from the PCB 50 along the Z axis in the "–Z" direction" (for instance, away from the page).

Figure 6:
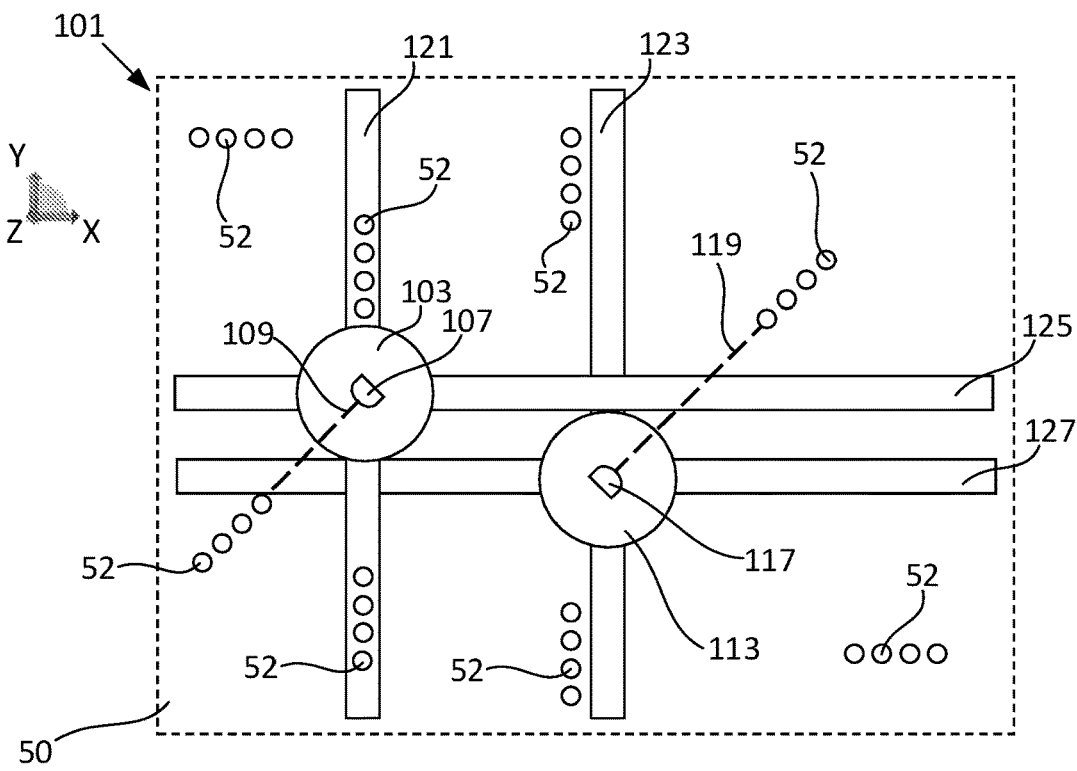

As shown in FIG. 6, the first solder pot 103 and the second solder pot 113 are repositioned from the configuration shown in FIG. 5 for processing the next solder pin 52 by moving in the X-Y plane. The first solder pot 103 is rotated about the Z axis anticlockwise by 45 degrees to align with a group of solder pins 52 that are offset from the X and Y axes. The first solder pot 103 is then moved along a direction of travel 109 to process the solder pins 52. The second solder pot 113 is rotated about the Z axis anticlockwise by 45 degrees to align with another group of solder pins 52 that are offset from the X and Y axes. The second solder pot 113 is then moved along a direction of travel 119 to process the solder pins 52. Other rotational displacements are also envisaged other than 45 degrees.

Figure 7:
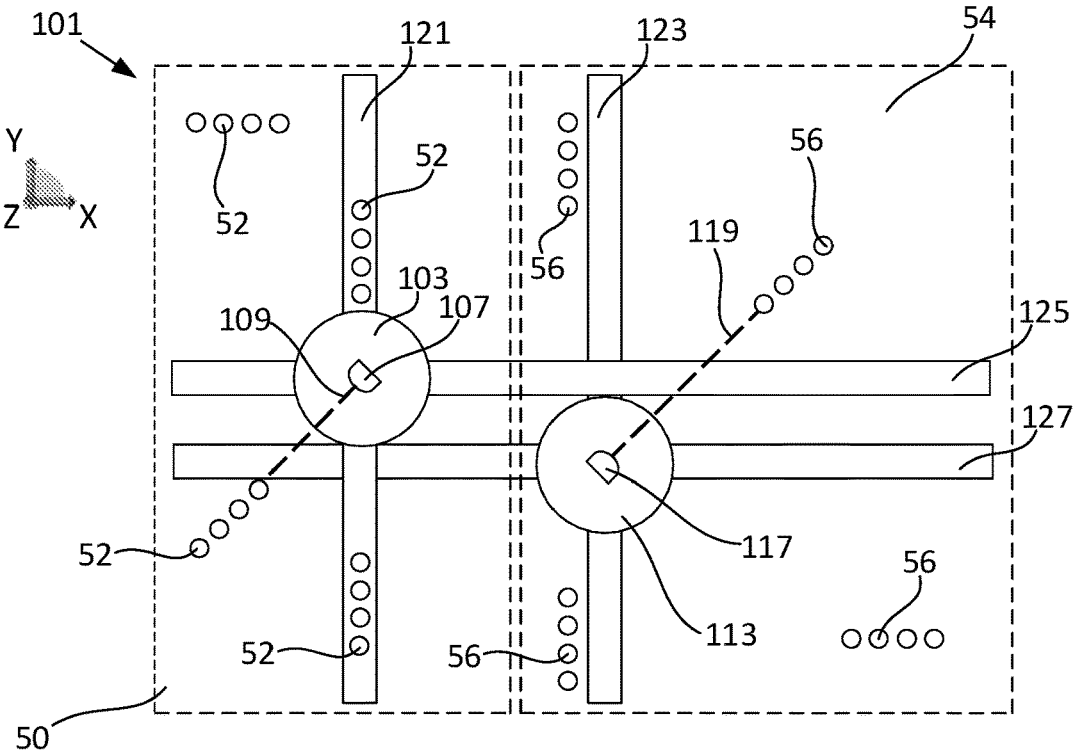
FIG. 7 illustrates a schematic illustration of a soldering system according to an example of the disclosure, having first and second solder pots simultaneously processing a pair of printed circuit boards (with one solder pot processing each printed circuit board respectively).

Referring now to FIG. 7, there is shown a soldering system 101 used to simultaneously solder a pair of PCBs 50, 54. A first PCB 50 has a number of solder pins 52. A second PCB 54 has a number of solder pins 56. The respective solder pins 52,56 are provided on separate PCBs 50,54. The first solder pot 103 and the second solder pot 113 are each arranged to move in three-dimensional space independently of one another. In this example arrangement, the first solder pot 103 provides a solder wave 107 orientated in a predetermined direction such that when the solder wave 107 contacts a solder pin 52 of the first PCB 50, solder is deposited onto the solder pin 52. The second solder pot 113 provides a solder wave 117 orientated in a predetermined direction such that when the solder wave 117 contacts a solder pin 56 of the second PCB 54, solder is deposited onto the solder pin 56.

Thus, each of the first solder pot 103 and the second solder pot 113 can simultaneously provide solder on solder pins 52,56 located on a pair of PCBs 50,54. It is envisaged that in alternative configurations, both the first solder pot 103 and the second solder pot 113 can be moved and orientated so as to provide solder on solder pins on the same PCB. It is also envisaged that the first and second solder pots 103,113 can provide solder on solder pins on more than two PCBs. For example, a soldering system 101 may have a first solder pot 103 that can provide solder onto solder pins on a first PCB, while the second solder pot 113 can provide solder onto solder pins on second and third PCBs.

In the aforementioned example embodiments, the solder pots 103, 113 each have a respective solder pot axis (also known as a "U-axis") that is parallel to the Z axis and displaced relative to one another along the X-Y plane. The solder pots 103,113 may be rotatable about their solder pot axis (i.e. rotatable about the "U-axis") independently of one another. In addition, although the solder pots 103,113 are described in the aforementioned example embodiments to be rotatable about the Z axis or their solder pot axis, the solder pots 103,113 may additionally or alternative be rotatable about the X axis, Y axis, or both the X axis and the Y axis.

U-rotation serves for a non-wettable nozzle to ensure that when the nozzle is moved relative to the PCB in the X-Y plane, the side of the nozzle from which solder is overflowing is presented first to the pin to the soldered: it is upstream in the direction of movement of the nozzle. For either nozzle type where an SDC is provided, the U-rotation serves to ensure that the SDC is downstream. For a given nozzle, the angular position about the Z axis at which the nozzle can solder is set. That is, for a solder pot in its default orientation about the Z axis, a first nozzle may solder at 90° and a second nozzle may solder at 45°. To solder at any other angle requires the solder pot to first be rotated.

In an alternative configuration, a row or group of solder pins may be processed from either end together by the solder pots. The first solder pot is moved along the X-Y plane and rotated about the Z axis to align with one end of the group of solder pins. The second solder pot is moved along the X-Y plane and rotated about the Z axis to align with the other end of the group of solder pins. The first solder pot and the second solder pot are then moved in the X-Y plane. The processing of the solder pins may be carried out simultaneously by the first solder pot and the second solder pot.

Alternatively, the processing of the solder pins by the first solder pot and the second solder pot may be carried out one after the other.

Advantageously, by facilitating the movement of solder pots in the X, Y, and Z directions and at least one solder pot further facilitating rotation about one or more of the axes, the soldering operation is made more efficient. This may allow for a greater versatility of solder pots movement in order to process different printed circuit board designs. In particular, at least one of the solder pots may approach a solder pin placed in any position, from any direction. This increases the efficiency and processing speed of the soldering system. Where only one solder pot rotates, this enables the use of one wettable (fixed) and one non-wettable (rotating) nozzle, or one solder pot without SDC (larger nozzle for non-critical components) and pot with SDC for fine pitch connectors and ability to de-bridge with SDC.

In some examples the nozzle of one or both solder pots may be formed from stacked layers of a metal, for instance stainless steel or titanium. The stacked layers may be deposited during an additive manufacturing, or 3D printing, process. That is, during construction, successive layers of stainless steel or titanium are deposited to build up the nozzle structure, including the bounding walls of the at least one channel.

As an example of an additive manufacturing or 3D printing process, a thin layer (for example, of 20 to 100 microns thickness) of metal powder (for example stainless steel or titanium) is laid down on top of a build-plate. The powder is melted or welded together in predetermined positions, for example by a laser or welding means. The predetermined positions may be defined by a 3D CAD model, for example. The build-plate is lowered by a distance substantially corresponding to the thickness of the thin layer and these steps are repeated. Once the required number of layers have been added, the non-melted/welded powder is removed to reveal the component inside. The component may be heat treated to improve the mechanical properties or post-processed (for example turning, milling, tumbling or shot peening).

The construction of a nozzle in this way allows different shapes and models to be produced that would generally not be possible with milling, drilling or casting processes. As such, nozzles with improved functionality may be produced. In addition, the use of materials within the printed nozzles may be more efficient.

Previously, it would have been expected that a 3D printed component, such as the nozzle of this disclosure, would have a rough surface (as a result of the addition of successive layers). As such, there would be an expectation that the roughened surface of the nozzle (in particular, the surface defining the channel) may affect the nozzles ability to produce a consistent, laminar flow of solder. However, surprisingly, this has found to not be an issue for the 3D printed nozzle.

In some examples, the nozzle may be at least partially diffusion coated with chromium carbide so as to protect the stacked layers from corrosion, for example from corrosive solder. The process of diffusion coating with chromium carbide is sometimes referred to as inchromizing (for example, hard inchromizing). In other words, the nozzle is at least partially hard inchromized.

In general, diffusion coating is a diffusion process where a layer of a material, for example a ceramic material is applied to a metal surface. In an inchromizing process, ceramic chromium carbide (CRxCy), for example in the form of a powder, is applied to the metal surface. In this example, the chromium carbide powder is brought into contact with the stainless steel or titanium and heated to approximately 850° C. for several hours (ranging from about 2 hours to 60 hours depending on the nozzle size). The resulting diffusion layer may have a thickness of from about 5 μm to about 25 μm. After treatment, the surface is extremely hard, densely structured and resistant to wear.

An advantage of diffusion coating over other coating methods is that bonding issues between the base material and the surface layer are reduced. In addition, diffusion coating with chromium carbide provides improved corrosion resistance over other types of protective corrosion coatings.

In some examples, the entire surface of the nozzle is diffusion coated. However, in other examples only portions of the surface of the nozzle that may come into contact with the solder are coated (for example the defining walls of the channel and portions of the exterior surface over which the solder may flow).

The expected roughened surface of the 3D printed component may have also led to doubts as to the effects of inchromizing of a 3D printed component on the microstructure of the printed nozzle. In other words, manufacturers may have been detracted from treating the nozzle in this way over concerns for the effectiveness of the corrosion resistance of the nozzle. However, surprisingly, the applicant has found that inchromizing the nozzle provides comparable results to a non-3D printed nozzle.

For example, it has been found that inchromizing the surface of the nozzle in this way makes the nozzle non-wettable, which helps extend the lifetime of nozzle. For example, the lifetime of an inchromized nozzle may be greater than 5 years in comparison to a wettable nozzle (for example made of carbon steel), which may only have a lifetime of approximately 2 weeks.

It will be clear to a person skilled in the art that features described in relation to any of the embodiments described above can be applicable interchangeably between the different embodiments. The embodiments described above are examples to illustrate various features of the disclosure.

For the avoidance of doubt, the terms "may", "and/or", "e.g.", "for example" and any similar term as used herein should be interpreted as non-limiting such that any feature so-described need not be present. Indeed, any combination of optional features is expressly envisaged without departing from the scope of the disclosure, whether or not these are expressly claimed. The applicant reserves the right to change any originally filed claim or file any new claim accordingly, including the right to amend any originally filed claim to depend from and/or incorporate any feature of any other claim although not originally claimed in that manner.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

It will be appreciated by those skilled in the art that several variations to the aforementioned embodiments are envisaged without departing from the scope of the disclosure. It will also be appreciated by those skilled in the art that any number of combinations of the aforementioned features and/or those shown in the appended drawings provide clear advantages over the prior art and are therefore within the scope of the disclosure described herein.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A soldering system for processing at least one printed circuit board, comprising:
   a first solder pot and a second solder pot, each configured to move within a movement plane;
   wherein at least one of the first solder pot and the second solder pot defines a solder pot axis extending transverse to the movement plane and is further configured to rotate about its solder pot axis;
   wherein the first solder pot and the second solder pot can be moved within the movement plane relative to the at least one printed circuit board, and at least one of the first solder pot and the second solder pot can be rotated about its solder pot axis relative to the at least one printed circuit board, to simultaneously process the at least one printed circuit board using both solder pots.

2. The soldering system according to claim 1, wherein at least one of the first solder pot and the second solder pot is further configured to move along its solder pot axis towards or away from the movement plane.

3. The soldering system according to claim 2, wherein the first solder pot and the second solder pot each define respective first and second solder pot axes extending transverse to the movement plane
   wherein each solder pot is further configured to rotate about its respective solder pot axis, relative to the at least one printed circuit board; and
   wherein each solder pot is further configured to move along its respective solder pot axis towards or away from the movement plane.

4. The soldering system according to claim 1, wherein the movement plane is defined by orthogonal X and Y axes and the or each solder pot axis is parallel to a Z axis which is orthogonal to the movement plane.

5. The soldering system according to claim 1, further comprising:
   a first displacement member and a second displacement member, each displaceable along respective first and second directions within the movement plane; and
   a first moving member and a second moving member, each displaceable along and rotatable about an axis transverse to the movement plane.

6. The soldering system according to claim 5, wherein the first solder pot is configured to operably couple to the first displacement member and the first moving member, and the second solder pot is configured to operably couple to the second displacement member and the second moving member; and
   wherein movement of the first displacement member or the second displacement member causes the respective first solder pot or second solder pot to move within the movement plane and movement of a moving member causes the respective first solder pot or second solder pot to move along its solder pot axis transverse to the movement plane or rotate about its solder pot axis.

7. The soldering system according to claim 5, wherein at least one of the first displacement member or the second displacement member is rotatable about an axis within the movement plane.

8. The soldering system according to any one of claim 5, wherein the movement plane is defined by orthogonal X and Y axes; and wherein each displacement member comprises an X axis translation element displaceable along the X axis, and a Y axis translation element displaceable along the Y axis.

9. The soldering system according to claim 1, wherein each solder pot is operably coupled to a respective nozzle.

10. The soldering system according to claim 9, wherein each nozzle is configured to form an asymmetric solder wave about its solder pot axis, during use.

11. The soldering system according to claim 1, wherein the first solder pot and the second solder pot can be moved relative to a single printed circuit board, to simultaneously process the single printed circuit board using both solder pots.

12. The soldering system according to claim 1, wherein at least one of the first solder pot and the second solder pot can be rotated relative to a single printed circuit board, to simultaneously process the single printed circuit board using both solder pots.

13. The soldering system according claim 1, wherein the first solder pot and the second solder pot can be moved relative to a pair of printed circuit boards, to simultaneously process the pair of printed circuit boards using both solder pots.

14. The soldering system according to claim 1, wherein the first solder pot and the second solder pot can be rotated relative to a pair of printed circuit boards, to simultaneously process the pair of printed circuit boards using both solder pots.

15. A method of using a soldering system in a soldering process for processing at least one printed circuit board, comprising:

providing a first solder pot;

providing a second solder pot;

moving the first solder pot and the second solder pot within a movement plane relative to the at least one printed circuit board;

rotating at least one of the first solder pot and the second solder pot about a solder pot axis extending transverse to the movement plane and relative to the at least one printed circuit board; and simultaneously processing the at least one printed circuit board using both solder pots.

16. The method according to claim 15, wherein the soldering system comprises a first solder pot and a second solder pot, each configured to move within a movement plane;

wherein at least one of the first solder pot and the second solder pot defines a solder pot axis extending transverse to the movement plane and is further configured to rotate about its solder pot axis;

wherein the first solder pot and the second solder pot can be moved within the movement plane relative to the at least one printed circuit board, and at least one of the first solder pot and the second solder pot can be rotated about its solder pot axis relative to the at least one printed circuit board, to simultaneously process the at least one printed circuit board using both solder pots.

* * * * *